United States Patent
Orikabe et al.

(10) Patent No.: US 6,818,702 B1
(45) Date of Patent: Nov. 16, 2004

(54) THERMOSETTING RESIN COMPOSITION AND FLEXIBLE CIRCUIT OVERCOATING MATERIAL COMPRISING THE SAME

(75) Inventors: Hiroshi Orikabe, Kawasaki (JP);
Hiroshi Sakamoto, Kawasaki (JP);
Tadahiko Yokota, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 09/926,370

(22) PCT Filed: Apr. 21, 2000

(86) PCT No.: PCT/JP00/02646
§ 371 (c)(1),
(2), (4) Date: Dec. 28, 2001

(87) PCT Pub. No.: WO00/64960
PCT Pub. Date: Nov. 2, 2000

(30) Foreign Application Priority Data

Apr. 22, 1999 (JP) .......................................... 11/115081

(51) Int. Cl.⁷ ................................................ C08L 63/10
(52) U.S. Cl. ..................... 525/107; 525/111; 525/113; 525/114; 525/119; 525/120; 525/122; 525/130; 525/236; 525/523; 525/524; 525/525; 525/528; 525/529; 525/530; 525/531; 525/532; 525/533; 528/392
(58) Field of Search .............................. 525/529, 530, 525/533, 53, 524, 525, 236, 111, 119, 107, 113, 114, 120, 122, 130, 523, 528, 531, 532; 528/392

(56) References Cited

U.S. PATENT DOCUMENTS

| 4,130,546 | A | | 12/1978 | Goto et al. |
| 5,276,097 | A | * | 1/1994 | Hoffmann et al. .......... 525/167 |
| 5,477,080 | A | | 12/1995 | Ishisaka et al. |
| 6,162,889 | A | | 12/2000 | Orikabe et al. |
| 6,335,417 | B1 | | 1/2002 | Orikabe et al. |
| 6,380,343 | B1 | | 4/2002 | Orikabe et al. |
| 6,433,123 | B2 | | 8/2002 | Orikabe et al. |

FOREIGN PATENT DOCUMENTS

| EP | 0 851 726 | 7/1998 |
| JP | 11-74317 | 3/1999 |

OTHER PUBLICATIONS

Abstract, JP 4–015272, Tomita et al., Jan. 20, 1992, CAPLUS on STN, AN 1992:216449.*

Abstract, JP 11071445, Yamamoto, Mar. 16, 1999.

Abstract, JP 08277320, Osagawa, Oct. 22, 1996.

Abstract, JP 07304854, Tsuchiya, Nov. 21, 1995.

Abstract, JP 07268277, Takeda, Oct. 17, 1995.

* cited by examiner

Primary Examiner—David J. Buttner
Assistant Examiner—Christopher Keehan
(74) Attorney, Agent, or Firm—Oblon, Spivak, McClelland, Maier & Neustadt, P.C.

(57) ABSTRACT

A thermosetting resin composition that is useful as an epoxy resin-based overcoating agent for flexible circuit boards or for film carriers for the TAB method, and the like, providing basic properties required of general insulation protective films, since the cured coated films are excellent in adhesiveness, electric insulation property, chemical resistance, thermal resistance, and the like, reduced in warp caused by cure shrinkage, and excellent in flexibility.

12 Claims, No Drawings

THERMOSETTING RESIN COMPOSITION AND FLEXIBLE CIRCUIT OVERCOATING MATERIAL COMPRISING THE SAME

TECHNICAL FIELD

The present invention relates to an epoxy resin-based thermosetting composition affording a cured coated film which is reduced in warp caused by cure shrinkage and is excellent in flexibility, and also to an overcoating material for a flexible circuit board using the same. Further, it relates to a film carrier coated with the overcoating material and to a film device wherein the film carrier is used.

BACKGROUND ART

Upon the adhesion between flexible substrates such as packaging materials, films or the like, or upon the coating of these surfaces, it is necessary to reduce as far as possible the influences of cure shrinkage of adhesives or coating materials (i.e., coating agents) to be used therefor or the influences of hardness of the cured products. Therefore, the adhesive or coating agent to be used for such fields of application should necessarily be those which exhibit a small cure shrinkage as far as possible and at the same time, afford cured products having a sufficient flexibility. As thermosetting resin compositions affording flexible cured products, there have hitherto been known compositions comprising, as the main component, a natural or synthetic rubber, urethane-based resin, silicon-based resin, or modified epoxy resin having the skeleton of such rubber or resin. However, such rubber-based resin compositions can be indeed produced relatively at a low cost and the cured products thereof are excellent in flexibility, but they are inferior in weather resistance, heat resistance and chemical resistance. Although it has been attempted to solve these defects, the effects have not been satisfactory. On the contrary, there have been pointed out problems that it is withheld to use chlorinated resins from the viewpoint of the increased understanding of environmental problems, and the like, because such resins sometimes suffer dechlorination upon their use in elevated humidity and temperature environment. Moreover, urethane-based resins also afford cured products excellent in flexibility, but they cannot be said to be satisfactory in weather resistance, chemical resistance, heat resistance, and the like. Furthermore, silicone-based resins whose cured products exhibit both of flexibility and the performances such as weather resistance, chemical resistance, thermal resistance and the like, similarly have defects that the cost of law materials thereof is high and undercoating treatment with a primer is necessary because of their poor adhesiveness to other substrates, and the like. On the other hand, resin compositions comprising, as the main component, an epoxy resin modified with rubber, urethane, or silicon have widely been used because their cured products have an appropriate flexibility and at the same time, performances such as weather resistance, chemical resistance, thermal resistance, and the like. However, any modified epoxy resisin composition has not been yet obtained, whose cured product is sufficiently statisfactory in flexibility and cure shrinkage.

Moreover, with regard to thermosetting resin compositions, as the fields of application thereof which requires electric insulation property, plating resistance and the like, in addition to the above various properties, there may be mentioned surface protecting films for flexible circuit boards whose needs have rapidly increased in recent years. It has been the mainstream to use polyimide films called coverlay films, as the surface protecting films for flexible wiring circuits. The formation of the protecting film using such coverlay film comprises steps of making a die corresponding to the circuit pattern, punching a film for forming the protecting film with the use of the die, and further adhering the punched film onto a substrate with an adhesive. Thus, it is not so preferable in view of the workability because of the complicated steps. On the other hand, a method has been also known, wherein a thermosetting-type overcoating agent as mentioned above, comprising, as the main component, a modified epoxy resin having flexibility or the like, is applied by a screen printing method and then cured. This method is preferable in view of the workability owing to the simple steps, but is still unsatisfactory from the viewpoints of the properties of the cured products such as warp caused by cure shrinkage, flexibility, and the like, so that the method is mainly applied to only the substrates of low added value.

Furthermore, recently, the so-called TAB method using film carriers has been increasingly employed for the purpose of imparting a higher density and a less thickness to an IC package, making use of the technology for forming flexible circuit boards. This method is mainly employed for forming an IC package for driving liquid-crystals. The basic structure of such film carrier is mainly composed of heat-resistant, insulating film base such as polyimide or the like, and an electrical conductor such as copper foil or the like, glued onto the film base through an adhesive containing an epoxy resin as the main component, the wiring pattern having been formed on the copper foil by etching. And, a film carrier device is made by connecting an IC to such tape carrier, followed by sealing with the use of a sealing resin. To prevent the decrease of reliability owing to pattern short, erosion, migration, whisker occurrence, or the like, during the steps before the IC connection, a surface protecting film is usually formed also on such film carrier, using an overcoating agent. As such overcoating agent for film carriers, there have been used an epoxy-based one and a polyimide-based one. However, the former is not satisfactory in warp during curing and flexibility of the coated film, and the latter is not satisfactory in adhesiveness to the IC sealing resin, workability or the like. For these reasons, at present, two or more different overcoating agents are concurrently used to compensate each other (Japanese Patent Application Laid-Open No. 283575/1994).

DISCLOSURE OF THE INVENTION

It is an object of the present invention to provide a thermosetting resin composition which is improved in the occurrence of warp caused by cure shrinkage and the insufficiency in flexibility of the cured products thereof, which are the problems of conventional thermosetting resin compositions. It is another object thereof to provide an epoxy resin-based overcoating agent or material for flexible circuit boards, which has basic properties required of general insulation protective films such as tight adhesiveness, electric insulation property, chemical resistance, thermal resistance, and Sn-plating resistance, and the like. It is still another object of the present invention to provide an overcoating agent which can be used for film carriers for the TAB method. And, it is a further object thereof to provide a film carrier formed by applying the overcoating agent thereonto and a film carrier device using the film carrier.

The present inventors have studied intensively to achieve the above objects, and as the results, found that the concurrent use of not only a single resin having a flexible skeleton as in the prior art, but also a resin whose molecular weight and functional group number per one molecule are restricted to a certain range, as the components of a thermosetting resin composition, results in that the crosslinking density of the cured product thereof can be appropriately regulated, whereby a cured coated film remarkably reduced in warp caused by cure shrinkage and also more excellent in flexibility can be afforded, with the basic properties given by common thermosetting compositions such as tight adhesiveness, electric insulation property, chemical resistance, thermal resistance, and the like being maintained. The present invention has been accomplished on the basis of these findings.

Accordingly, a first thermosetting resin composition of the present invention comprises an epoxy-group(-containing) resin (Component (A)), and a resin (Component (B)) containing a functional group capable of reacting with the epoxy group, such as carboxyl group, amino group, acid anhydride group, hydrazide group, mercapto group, hydroxyl group, isocyanate group or the like and having no blocked carboxyl group, the molecular weight and functional group number per one molecule of both resins being defined as follows. That is, it is a thermosetting resin composition wherein the Component (A) has a number average molecular weight of 800 to 35, 000, an average functional group number of more than 2 per one molecule, and a functional group equivalent of 150 to 2,000 g/mol, and may have a polybutadiene or hydrogenated polybutadiene skeleton, whereas the Component (B) has a number average molecular weight of 800 to 35,000, an average functional group number of more than 2 per one molecule, and a functional group equivalent of 150 to 2,000 g/mol, and contains one or more functional groups selected from amino group, carboxyl group, acid anhydride group, mercapto group, hydroxyl group, isocyanate group and hydrazide group, and contains no blocked carboxyl group, and may have a polybutadiene or hydrogenated polybutadiene skeleton, and the ratio of the Component (B) to the Component (A) is from 0.5 to 2.0 in terms of the overall equivalent number of the functional group(s) of Component (B) capable of reacting with the epoxy group of the Component (A) to the overall equivalent number of the epoxy group of the Component (A).

Furthermore, a second thermosetting resin composition of the present invention is the first thermosetting resin composition wherein other kinds of an epoxy resin (Component (c)) and a resin (Component (d)) are added. That is, it is a thermosetting resin composition wherein an epoxy resin (Component (c)) which has a number average molecular weight of 7,000 to 35,000, an average functional group number of 2 or more per one molecule, and a functional group equivalent of 2,000 to 18,000 g/mol, and which may have a polybutadiene or hydrogenated polybutadiene skeleton is incorporated in combination with the above Component (A), both resins being incorporated in such ratio that the total average equivalent becomes 300 to 2,000 g/mol (both resins being collectively referred to herein as Component (C)), or/and a resin (Component (d)) which has a number average molecular weight of 7,000 to 35,000, an average functional group number of 2 or more per one molecule, and a functional group equivalent of 2, 000 to 18, 000 g/mol, which contains one or more functional groups selected from carboxyl group, amino group, acid anhydride group, hydrazide group, mercapto group, hydroxyl group and isocyanate group, and has no blocked carboxyl group, and which may have a polybutadiene or hydrogenated polybutadiene skeleton is incorporated in combination with the above Component (B), both resins be being incorporated in such ratio that the total average equivalent becomes 300 to 2,000 g/mol (both resins being collectively referred to herein as Component (D)), and the ratio of the Component (D) to the Component (C) is from 0.5 to 2.0 in terms of the overall equivalent number of the functional group(s) of Component (D) capable of reacting with the epoxy group of the Component (C) to the overall equivalent number of the epoxy group of the Component (C).

The present invention also relates to an overcoating agent for flexible circuit boards, wherein the above thermosetting resin composition is employed. The present invention further relates to a film carrier comprising an insulating film and a pattern formed thereon of metal thin film, with a part or all of the insulating film in the folded region having been removed, wherein the circuit pattern side except the joint region including the folded region, is coated with the overcoating agent and cured, and to a film carrier device employing the film carrier.

In the following will be described the present invention in greater detail.

With regard to the properties of cured products resulting from thermosetting resin compositions, thermal resistance, chemical resistance, and the like are properties which are generally improved with the increase of the crosslinking density, while flexibility and the like are properties which are improved with the decrease of the crosslinking density. Moreover, the warp caused by cure shrinkage is reduced with the decrease of the crosslinking density. Therefore, for balancing these properties, the crosslinking density should be properly controlled, and specifically, it is important to use, as components constituting a thermosetting resin composition, those resins which have a certain restricted range of molecular weight and functional group number per one molecule of the resins.

The combined use of the epoxy resin (Component (A)) which has a number average molecular weight of 800 to 35,000, an average functional group number of more than 2 per one molecule, and a functional group equivalent of 150 to 2,000 g/mol, and which may have a polybutadiene or hydrogenated polybutadiene skeleton, and the resin (Component (B)) which has a number average molecular weight of 800 to 35,000, an average functional group number of more than 2 per one molecule, and a functional group equivalent of 150 to 2,000 g/mol, which contains one or more functional groups selected from among carboxyl group, amino group, acid anhydride group, hydrazide group, mercapto group, hydroxyl group and isocyanate group, and has no blocked carboxyl group, and which may have a polybutadiene or hydrogenated polybutadiene skeleton, both resins being used in the thermosetting resin composition of the present invention, is important for imparting well-balancedly both kinds of properties, one being properties such as thermal resistance, chemical resistance and the like which can be achieved at a high crosslinking density, and the other being properties such as flexibility, low shrinkage upon curing, and the like which can be achieved at a low crosslinking density. And, the optimum crosslinking density can be attained by combining Component (A) and Component (B) in a range of 0.5 to 2.0 in terms of equivalent ratio. In particular, when an (epoxy) resin having a double bond such as polybutadiene is to be used, it is more preferable, since the double bonds per as participate slightly in the reaction, to use a resin having a functional group equivalent of about 700 to 2,000 g/mol which is positioned at the upper limit defined according to the present invention or its vicinity with regard to either or both of Components (A) and (B), whereas, when an (epoxy) resin having no double bond such as hydrogenated polybutadiene is to be used, it is more preferable to use a resin having a functional group equivalent of about 300 to 1,300 g/mol with regard to either or both of Components (A) and (B). When the functional group equivalent is smaller than the range, a harder cured product is formed owing to the increased crosslinking density upon curing, whereby a sufficient flexibility cannot be attained for the cured product and also cure shrinkage also becomes large. On the other hand, when the functional group equivalent is larger than the range, more flexible cured product is formed owing to the decreased crosslinking density upon curing, but the cured product is remarkably decreased in thermal resistance and chemical resistance. Moreover, the mixing ratio of Component (A) and Component (B) is out of a range of 0.5 to 2.0, many unreacted functional groups remain even after curing, so that a sufficient curing cannot be achieved, and, in turn, the intended properties cannot be attained.

Since the total functional group equivalent in the system is important for attaining a proper closslinking density, it is also preferable to adjust finely the total equivalent number in the system to its optimum by further incorporating a resin having an equivalent which is out of the above equivalent range. For example, taling up as the epoxy resin, on the one hand, an epoxy resin (Component (c)) which has a number average molecular weight of 7,000 to 35,000, an average functional group number of 2 or more per one molecule, and a functional group equivalent of 2, 000 to 18, 000 g/mol, and which may have a polybutadiene or hydrogenated polybutadiene skeleton, used in combination with the epoxy resin of the above Component (A) (the combination of both resins being collectively herein referred to as Component (C)), both resins being incorporated in such ratio that the total average equivalent becomes 300 to 2,000 g/mol, and on the other hand, a resin (Component (d)) which has a number average molecular weight of 7,000 to 35,000, an average functional group number of 2 or more per one molecule, and a functional group equivalent of 2,000 to 18,000 g/mol, which contains one or more functional groups selected from among carboxyl group, amino group, acid anhydride group, hydrazide group, mercapto group, hydroxyl group and isocyanate group, and has no blocked carboxyl group, and which may have a polybutadiene or hydrogenated polybutadiene skeleton, used in combination with the Component (B) (the combination of both resins being collectively herein referred to as Component (D)), both resins being incorporated in such ratio that the total average equivalent becomes 300 to 2,000 g/mol, then Component (C) and Component (D) can be used as an epoxy resin component corresponding to the above Component (A) and a component having a functional group capable of reacting with the epoxy group corresponding to the above Component (B), respectively. At that time, it is necessary to incorporate the two in such ratio that Component (D) to Component (C) becomes from 0.5 to 2.0 in terms of the overall equivalent number of the functional group(s) of Component (D) capable of reacting with the epoxy group of the Component (C) to the overall equivalent number of the epoxy group of the Component (C).

Component (c) and Component (d) exhibit a function of decreasing the crosslinking density to enhance the flexibility of the cured product and suppress cure shrinkage. Therefore, when their functional group equivalent is less than the range, this effect can not be thoroughly exhibited, and this case is not so preferable. And, when their functional group equivalent is more than the range, sufficient curing cannot be achieved all over the system and the intended physical properties cannot be attained.

Incidentally, the functional group equivalent with regard to carboxyl group, amino group, acid anhydride group, hydrazide group, mercapto group, hydroxyl group and isocyanate group which Component (B) and Component (d) contain, is defined on the basis of the number of reaction points each of which reacts with one epoxy group. For example, since a primary amino group has two active hydrogens capable of reacting with epoxy group, aniline (molecular weight: 93.13), for instance, is counted as bi-functional, and thus, the functional group equivalent thereof is calculated as 46.57.

Moreover, with regard to Components (A), (B), (c), and (d), when a component whose chemical structure has a polybutadiene skeleton is used, a cured resin composition having an increased flexibility can be obtained, and thus this case is preferable. The double bonds in the polybutadiene skeleton are allowed to react gradually, especially under a high temperature air atmosphere, which may, in turn, induce problems such as hardening of coated film and increase of warp, and the like, but these problems can be reduced by hydrogenating 50% or more of the double bonds, and thus this case is further preferable.

Furthermore, with regard to the above Components (A) and (B), the number average molecular weight is preferably 800 to 35,000, more preferably 800 to 25,000. When the molecular weight is larger than this range, the solubility thereof in a solvent decreases and miscibility with another resin having a different structure decreases, so that it becomes difficult to use them as an ingredient of a resin composition. And, even when it is possible to prepare them into a composition, the resulting composition gets increased in stringiness, and thus decreased in applicability onto a substrate. On the other hand, when the molecular weight is smaller than the range, the decrease of flexibility and the large cure shrinkage in the cured product tend to occur, and thus this case is not so preferable. Similarly, with regard to the above Components (c) and (d), the number average molecular weight is preferably 7,000 to 35,000, more preferably 7,000 to 25,000. When the molecular weight is larger than this range, the solubility in a solvent decreases and miscibility with another resin having a different structure decreases, so that it becomes difficult to use them as a component of a resin composition. And, even when it is possible to prepare them into a composition, the large stringiness of the composition is observed and thus the applicability onto a substrate decreases. On the other hand, since Component (c) and Component (d) exhibit a function of enhancing the flexibility of a cured product and inhibiting cure shrinkage, this effect can not be thoroughly exhibited when the molecular weight is smaller than the range, and thus this case is not so preferable.

As a resin containing epoxy group(s) (Component (A)), there maybe mentioned any epoxy resin insofar as it has a number average molecular weight of 800 to 35,000, an average functional group number of more than 2 per one molecule, and a functional group equivalent of 150 to 2,000 g/mol. However, particularly preferred is an epoxy resin having a flexible skeleton. Inter alia, a resin having a polybutadiene skeleton is preferable for imparting a more flexibility, and examples thereof include "BF1000" (manufactured by Nippon Soda Co., Ltd.) and the like. More preferred is an epoxy resin having a hydrogenated polybutadiene skeleton, and examples thereof include an epoxydated hydrogenated polybutadiene obtained by partially hydrogenating the double bonds in polybutadiene homopolymer having an average molecular weight of about 1,000 such as "B-1000" (manufactured by Nippon Soda Co., Ltd.) or the like, followed by epoxidating the remaining double bonds, an epoxydated hydrogenated polybutadiene obtained by reacting a hydrogenated polybutadiene polyol having an average molecular weight of about 1,000 such as "GI-1000" (manufactured by Nippon Soda Co., Ltd.) or the like, with a diisocyanate compound such as 2,4-tolylene diisocyanate or the like, at a ratio of 2 equivalents relative to 1 equivalent of the hydroxyl group of the former polyol in such way that the isocyanate group(s) remain at the terminal(s), followed by adding for addition reaction, to the resulting product, an epoxy compound having one hydroxyl group in one molecule such as "Epiol G-100" (manufactured by Nippon Oils & Fats Co., Ltd.), and the like.

As a resin containing epoxy group(s) (Component (c)), there may be mentioned any epoxy resin insofar as it has a number average molecular weight of 7,000 to 35,000, an average functional group number of 2 or more per one molecule, and a functional group equivalent of 2,000 to 18,000 g/mol. However, particularly preferred is an epoxy resin having a flexible skeleton. Inter alia, a resin having a polybutadiene skeleton is preferable for imparting a more flexibility, and examples thereof include an epoxydated hydrogenated polybutadiene obtained by reacting a polybutadiene polyol having an average molecular weight of about 3, 000 such as "G-3000" (manufactured by Nippon Soda Co., Ltd.) or the like, with a diisocyanate compound such as 2,4-tolylene diisocyanate or the like, at a ratio of 1 to 2 equivalents relative to 1 equivalent of the hydroxyl group of the former polyol so as to obtain a polymer having a higher molecular weight of about 7,000 to 35,000 in which isocyanate group(s) remain at the terminal(s), followed by adding for addition reaction, to the resulting product, an epoxy compound having one hydroxyl group in one molecule such as "Epiol G-100" (manufactured by Nippon oils & Fats Co., Ltd.), and the like. Further, more preferred is a resin having a hydrogenated polybutadiene skeleton, and examples thereof include an epoxydated hydrogenated polybutadiene obtained by reacting a hydrogenated polybutadiene polyol having an average molecular weight of about 3, 000 such as "GI-3000" (manufactured by Nippon Soda Co., Ltd.) or the like, with a diisocyanate compound such as 2,4-tolylene diisocyanate or the like, at a ratio of 1 to 2 equivalents relative to 1 equivalent of the hydroxyl group of the former polyol so as to obtain a polymer having a higher molecular weight of about 7,000 to 35,000 in which isocyanate group(s) remain at the terminal(s), followed by adding for addition reaction, to the resulting product, an epoxy compound having one hydroxyl group in one molecule such as "Epiol G-100" (manufactured by Nippon Oils & Fats Co., Ltd.), and the like.

As a resin containing one or more functional groups selected from among carboxyl group, amino group, acid anhydride group, hydrazide group, mercapto group, hydroxyl group and isocyanate group and having no blocked carboxyl group (Component (B)), there may be mentioned any resin insofar as it has a number average molecular weight of 800 to 35,000, an average functional group number of more than 2 per one molecule, and a functional group equivalent of 150 to 2,000 g/mol, the said functional group being carboxyl group, amino group, acid anhydride group, hydrazide group, mercapto group, hydroxyl group and/or isocyanate group. However, particularly preferred is a resin having a flexible skeleton. Inter alia, a resin having a polybutadiene skeleton is preferable for imparting a more flexibility, and examples thereof include polybutadienes modified with maleic anhydride such as "Laicon 130MA13" and "Laicon 131MA17" (both manufactured by Laicon Resin K.K.), and the like, carboxyl-terminated butadiene/acrylonitrile copolymers such as "Hicar CTBN 1300X8" (manufactured by Ube Industries Ltd.), amine-terminated butadiene/acrylonitril copolymers such as "Hicar CTBN 1300X16" (manufactured by Ube Industries Ltd.), and the like, polybutadiene polyols such as "R-45HT" (manufactured by Idemitsu Petrochemical Co., Ltd.), and "G-1000" and "GQ-1000" (both manufactured by Nippon Soda Co., Ltd.), and polybutadiene polyisocyanates such as "HTP-9" (manufactured by Idemitsu Petrochemical Co., Ltd.), and the like. Furthermore, more preferred are those having a hydrogenated polybutadiene skeleton, and examples thereof include a hydrogenated polybutadiene modified with maleic anhydride obtained by partially hydrogenating double bonds in polybutadiene homopolymer having an average molecular weight of about 1,000 such as "B-1000" (manufactured by Nippon Soda Co., Ltd.), followed by modifying the remaining double bonds with maleic anhydride, a hydrogenated polybutadiene polycarboxylic acid obtained by reacting a hydrogenated polybutadiene polyol having an average molecular weight of about 1,000 such as "GI-1000" (manufactured by Nippon Soda Co., Ltd.), or the like, with an acid anhydride compound such as trimellitic anhydride in an amount equimolar to 1 equivalent of the hydroxyl group of the former polyol in such way that carboxyl group(s) remain at the terminals), an hydrogenated polybutadiene polyisocyanate obtained by reacting a hydrogenated polybutadiene polyol having an average molecular weight of about 1,000 such as "GI-1000" (manufactured by Nippon Soda Co., Ltd.), or the like, with a diisocyanate compound such as 2,4-tolylene diisocyanate at a ratio of 2 equivalents relative to 1 equivalent of the hydroxyl group of the former polyol so that isocyanate group(s) remain at the terminals), and the like.

As a resin containing one or more functional groups selected from among carboxyl group, amino group, acid anhydride group, hydrazide group, mercapto group, hydroxyl group and isocyanate group and having no blocked carboxyl group (Component (d)), there may be mentioned any resin insofar as it has a number average molecular weight of 7,000 to 35,000, an average functional group number of 2 or more per one molecule, and a functional group equivalent of 2,000 to 18,000 g/mol, the said functional group being one or more of carboxyl group, amino group, acid anhydride group, hydrazide group, mercapto group, hydroxyl group and isocyanate group. However, particularly preferred is a resin having a flexible skeleton. Inter alia, a resin having a polybutadiene skeleton is preferable for imparting a more flexibility, and examples thereof include a polybutadiene polycarboxylic acid obtained by reacting a polybutadiene polyol having an average molecular weight of about 3, 000 such as "G-3000" (manufactured by Nippon Soda Co., Ltd.), or the like, with a diisocyanate compound such as 2,4-tolylene diisocyanate, or the like, at a ratio of 0.5 to 1 equivalent relative to 1 equivalent of the hydroxyl group of the former polyol so as to obtain a polymer having a higher molecular weight of about 7,000 to 35,000 in which hydroxyl group(s) remain at the terminal(s), followed by reacting the resulting product with an acid anhydride such as trimellitic anhydride or the like, in an amount equimolar to 1 equivalent of the hydroxyl group of the product so that carboxyl group(s) remain at the terminal(s), a polybutadiene polycarboxylic anhydride obtained by reacting a polybutadiene polyol having an average molecular weight of about 3,000 such as "G-3000" (manufactured by Nippon Soda Co., Ltd.) or the like, with a diisocyanate compound such as 2,4-tolylene diisocyanate, or the like, at a ratio of 1 to 2 equivalents relative to 1 equivalent of the hydroxyl group of the former polyol so as to obtain a polymer having a higher molecular weight of about 7,000 to 35,000 in which isocyanate group(s) remain at the terminal(s), followed by reacting the resulting product with a difunctional acid anhydride compound such as benzophenonetetracarboxylic acid dianhydride, or the like, at a ratio of 2 equivalents relative to 1 equivalent of the hydroxyl group so that anhydride group(s) remain at the terminal(s)., and the like. Furthermore, more preferred is a resin having a hydrogenated polybutadiene skeleton, and examples thereof include a hydrogenated polybutadiene polycarboxylic acid obtained by reacting a hydrogenated polybutadiene polyol having an average molecular weight of about 3,000 such as "GI3000" (manufactured by Nippon Soda Co., Ltd.), or the like, with a diisocyanate compound such as 2,4-tolylene diisocyanate, or the like, at a ratio of 0.5 to 1 equivalent relative to 1 equivalent of the hydroxyl group of the former polyol so as to obtain a polymer having a higher molecular weight of about 7,000 to 35,000 in which hydroxyl group(s) remain at the terminal (s), followed by reacting the resulting product with an acid anhydride such as trimellitic anhydride or the like, in an amount equimolar to 1 equivalent of the hydroxyl group of the product so that carboxyl group(s) remain at the terminal(s), a hydrogenated polybutadiene polycarboxylic anhydride obtained by reacting "GI-3000" with a diisocyanate compound such as 2,4-tolylene diisocyanate, or the like at a ratio of 1 to 2 equivalents relative to 1 equivalent of the hydroxyl group of the former polyol so as to obtain a polymer having a higher molecular weight of about 7,000 to 35,000 in which isocyanate group(s) remain at the terminal(s), followed by reacting the resulting product with a difunctional acid anhydride compound such as benzophenonetetracarboxylic acid dianhydride, or the like, at a ratio of 2 equivalents relative to 1 equivalent of the hydroxyl group so that anhydride group(s) remain at the terminal(s), and the like.

Moreover, the thermosetting resin composition of the present invention may, of course, optionally contain, if required, a curing accelerator for an epoxy resin composition, a filler, an additive, a thixotropic agent, a solvent and the like, in addition to the above essential and desired components. Particularly, in order to further improve bending resistance, fine rubber particles may be preferably added. Moreover, fine polyamide particles may be preferably added to further improve adhesiveness to a base copper circuit, a base material such as a polyimide, polyester film, or the like, and an adhesive layer.

As such fine rubber particles, there may be mentioned any fine particles of a resin exhibiting rubber elasticity such as acrylonitrile butadiene rubber, butadiene rubber, acryl rubber, and the like, which have been subjected to chemical crosslinking treatment to be made insoluble in an organic solvent and infusible. Examples thereof include "XER-91" (manufactured by Japan Synthetic Rubber Co., Ltd.), "Staphyloide AC3355", "Staphyloide AC3832" and "IM101" (manufactured by Takeda Chemical Industries, Ltd.), and "Paraloide EXL2655" and "EXL2602" (manufactured by Kureha Chemical Industries, Co., Ltd.), and the like.

As such fine polyamide particles, there may be mentioned any fine particles of 50 micron or smaller consisting of a resin having an amide linkage, for example, aliphatic polyamides such as nylon, aromatic polyamides such as Kevlar, and polyamidoimides. For example, "VESTOSINT 2070" (manufactured by Daicel Huls K.K.) and "SP500" (manufactured by Toray Industries, Inc.) may be mentioned.

BEST MODE FOR CARRYING OUT THE INVENTION

The production examples of epoxy resins and resins having a functional group capable of reacting with the epoxy resins to be used according to the present invention, and Examples of the present invention as well as Comparative Examples will be described to explain the present invention specifically.

<Production of Resin C>

"GI-1000" (OH terminated hydrogenated polybutadiene, Mn=about 1,500, OH equivalent=801 g/eq., and solid content=100 wt %; manufactured by Nippon Soda Co., Ltd.) (1,000 g), "Ipsol 150" (manufactured by Idemitsu Petrochemical Co., Ltd.) (998 g) and dibutyltin laurate (0.1 g) were charged in a reactor, mixed and homogeneously dissolved in a stream of nitrogen. The temperature was raised to 70° C. at the time when the mixture became homogeneous, and toluene-2,4-diisocyanate (NCO equivalent=87.08 g/eq.) (217 g) was added dropwise with further stirring over a period of 2 hours. The mixture was kept at the same temperature for additional one hour. At the time when titration revealed that the NCO content became about 2.37%, "Epiol G-100" (an epoxy compound containing OH group, OH equivalent=204 g/eq., and solid content=100 wt %; manufactured by Nippon Oils & Fats Co., Ltd.) (280 g) was added, and the resulting mixture was stirred for 2 hours with the temperature being maintained at 70° C. The mixture was cooled at the time when the disappearance of the NCO peak at 2,250 cm$^{-1}$ was confirmed by FT-IR (Fourier Transform infrared spectroscopy), whereby a resin was obtained. The resin will be referred to as Resin C.

Properties of Resin C: Mn=1,621, epoxy equivalent (including the solvent)=909 g/eq., and solid content=60 wt %.

<Production of Resin D>

"G-3000" (OH terminated polybutadiene, Mn=about 3,000, OH equivalent=1,776 g/eq., and solid content=100 wt %; manufactured by Nippon Soda Co., Ltd.) (1,000 g), "Ipsol 150" (manufactured by Idemitsu Petrochemical Co., Ltd.) (613 g) and dibutyltin laurate (0.1 g) were charged in a reactor, mixed and homogeneously dissolved in a stream of nitrogen. The temperature was raised to 70° C. at the time when the mixture became homogeneous, and toluene-2,4-diisocyanate (NCO equivalent=87.08 g/eq.) (56.4 g) was added dropwise with further stirring over a period of 2 hours. The mixture was kept at the same temperature for additional one hour. At the time when the NCO content became about 0.13% determined by titration, "Epiol G-100" (an epoxy compound containing OH group, OH equivalent=204 g/eq., and solid content=100 wt %; manufactured by Nippon Oils & Fats Co., Ltd.) (19 g) was added, and the resulting mixture was stirred for 2 hours with the temperature being maintained at 70° C. The mixture was cooled at the time when the disappearance of the NCO peak at 2,250 cm$^{-1}$ was confirmed by FT-IR (Fourier Transform infrared spectroscopy) to obtain a resin. The resin will be referred to as Resin D.

Properties of Resin D: Mn=18,125, epoxy equivalent (including the solvent)=14,470 g/eq., and solid content=40 wt %.

<Production of Resin E>

"GI-3000" (OH terminated polybutadiene, Mn=about 3,500, OH equivalent=1,870 g/eq., and solid content=100 wt %; manufactured by Nippon Soda Co., Ltd.) (1,000 g), "Ipsol 150" (manufactured by Idemitsu Petrochemical Co., Ltd.) (1,607.4 g) and dibutyltin laurate (0.1 g) were charged in a reactor, mixed and homogeneously dissolved in a stream of nitrogen. The temperature was raised to 70° C. at the time when the mixture became homogeneous, and further, toluene-2,4-diisocyanate (NCO equivalent=87.08 g/eq.) (53.6 g) was added dropwise with further stirring over a period of 2 hours. The mixture was kept at the same temperature for additional one hour. At the time when the NCO content became about 0.13% determined by titration, "Epiol G-100" (an epoxy compound containing OH group, OH equivalent=204 g/eq., and solid content=100 wt %; manufactured by Nippon Oils & Fats Co., Ltd.) (18 g), and the resulting mixture was stirred for 2 hours with the temperature being maintained at 70° C. The mixture was cooled at the time when the disappearance of the NCO peak at 2,250 cm$^{-1}$ was confirmed by FT-IR (Fourier Transform infrared spectroscopy) to obtain a resin. The resin will be referred to as Resin E. Properties of Resin E: Mn=17,264, epoxy equivalent (including the solvent)=15,187 g/eq., and solid content=40 wt %.

<Production of Resin F>

"G-1000" (OH terminated polybutadiene, Mn=about 1,500, OH equivalent=768.6 g/eq., and solid content=100 wt %; manufactured by Nippon Soda Co., Ltd.) (1,000 g), "Ipsol 150" (manufactured by Idemitsu Petrochemical Co., Ltd.) (278 g) and ethyl diglycol acetate (manufactured by Daicel Chemical Industries, Ltd.) (556 g) were charged in a reactor, mixed and homogeneously dissolved in a stream of nitrogen. At the time when the mixture became homogeneous, dimethylbenzylamine (10 g) and trimellitic anhydride (molecular weight: 192) (250 g) were added and mixed, and then the mixture was heated to 140° C. and stirred at the temperature. At the time when the acid value showed a constant value of about 70 mgKOH/g, the mixture was cooled to obtain a resin. The resin will referred to as Resin F.

Properties of Resin F: Mn=1,711, acid value (including the solvent)=70.1 mgKOH/g, and solid content=60 wt %.

<Production of Resin G>

"GI-1000" (OH terminated hydrogenated polybutadiene, Mn about 1,500, OH equivalent=801 g/eq., and solid content=100 wt %; manufactured by Nippon Soda Co., Ltd.) (1,000 g), "Ipsol 150" (manufactured by Idemitsu Petrochemical Co., Ltd.) (276 g) and ethyl diglycol acetate (manufactured by Daicel Chemical Industries, Ltd.) (551 g) were charged in a reactor, mixed and homogeneously dissolved in a stream of nitrogen. At the time when the mixture became homogeneous, dimethylbenzylamine (10 g) and trimellitic anhydride (molecular weight: 192) (240 g) were added and mixed, and then the mixture was heated to 140° C. and stirred at the temperature. At the time when the acid value showed a constant value of about 71 mgKOH/g, the mixture was cooled to obtain a resin. The resin will be referred to as Resin G.

Properties of Resin G: Mn=1,684, acid value (including the solvent)=70.7 mgKOH/g, and solid content=60 wt %.

<Production of Resin H>

"G-3000" (OH terminated polybutadiene, Mn=about 3,000, OH equivalent=1,776 g/eq., and solid content=100 wt %; manufactured by Nippon Soda Co., Ltd.) (1,000 q), "Ipsol 150" (manufactured by Idemitsu Petrochemical Co., Ltd.) (528.4 g) and dibutyltin laurate (0.1 g) were charged in a reactor, mixed and homogeneously dissolved in a stream of nitrogen. The temperature was raised to 70° C. at the time when the mixture became homogeneous, and toluene-2,4-diisocyanate (NCO equivalent=87.08 g/eq.) (42.6 g) was added dropwise with further stirring over a period of 2 hours. The mixture was kept at the same temperature for additional one hour. At the time when the disappearance of the NCO peak at 2,250 cm$^{-1}$ was confirmed by FT-IR, ethyl diglycol acetate (manufactured by Daicel Chemical Industries, Ltd.) (1,056.7), dimethylbenzylamine (10 g) and trimellitic anhydride (molecular weight: 192) (14.1 g) were added and mixed, and then the mixture was heated to 140° C. and stirred at the temperature. At the time when the acid value showed a value of about 3 mgKOH/g, the mixture was cooled to obtain a resin. The resin will be referred to as Resin H.

Properties of Resin H: Mn=16,244, acid value (including the solvent)=3.1 mgKOH/g, and solid content=40 wt %.

<Production of Resin I>

"GI-3000" (OH terminated hydrogenated polybutadiene, Mn=about 3,000, OH equivalent=1,870 g/eq., and solid content=100 wt %; manufactured by Nippon Soda Co., Ltd.) (1,000 g), "Ipsol 150" (manufactured by Idemitsu Petrochemical Co., Ltd.) (527 g) and dibutyltin laurate (0.1 g) were charged in a reactor, mixed and homogeneously dissolved in a stream of nitrogen. The temperature was raised to 70° C. at the time when the mixture became homogeneous, and toluene-2,4-diisocyanate (NCO equivalent=87.08 g/eq.) (40.5 g) was added dropwise with further stirring over a period of 2 hours. The mixture was kept at the same temperature for additional one hour. At the time when the disappearance of the NCO peak at 2,250 cm$^{-1}$ was confirmed by FT-IR, ethyl diglycol acetate (manufactured by Daicel Chemical Industries, Ltd.) (1,054), dimethylbenzylamine (10 g) and trimellitic anhydride (molecular weight: 192) (13.4 g) were added and mixed, and then the mixture was heated to 150° C. and stirred at the temperature. At the time when the acid value showed a value of about 3 mgKOH/g, the mixture was cooled to obtain a resin. The resin will be referred to as Resin I.

Properties of Resin I: Mn=17,865, acid value (including the solvent)=3.0 mgKOH/g, and solid content=40 wt %.

<Production of Resin J>

"G-3000" (OH terminated polybutadiene, Mn=about 3,000, OH equivalent=1,776 g/eq., and solid content=100 wt %; manufactured by Nippon Soda Co., Ltd.) (1,000 g), "Ipsol 150" (manufactured by Idemitsu Petrochemical Co., Ltd.) (541.8 g) and dibutyltin laurate (0.1 g) were charged in a reactor, mixed and homogeneously dissolved in a stream of nitrogen. The temperature was raised to 70° C. at the time when the mixture became homogeneous, and toluene-2,4-diisocyanate (NCO equivalent=87.08 g/eq.) (56.4 g) was added dropwise with further stirring over a period of 2 hours. The mixture was kept at the same temperature for additional one hour. At the time when the NCO content became about 0.13% determined by titration, ethyl diglycol acetate (manufactured by Daicel Chemical Industries, Ltd.) (1,083.6 g), dimethylbenzylamine (10 g) and benzophenonetetracarboxylic acid dianhydride (acid anhydride equivalent; 161 g/eg.) (27.2 g) were added and mixed, The resulting mixture was heated to 140° C. and stirred at the temperature. At the time when the disappearance of the NCO peak at 2,250 cm$^{-1}$ was confirmed by FT-IR, the mixture was cooled to obtain a resin. The resin will be referred to as Resin J.

Properties of Resin J: Mn=about 19, 962, acid anhydride equivalent (including the solvent)=32,059 g/eg., and solid content=40 wt %.

The individual components employed in Examples will be shown below:

<Component (A)>

"BF1000" (having polybutadiene skeletons, Mn=1,500, epoxy equivalent=178 g/eq., and solid content=100 wt %; manufactured by Nippon Soda Co., Ltd.)

Resin C (having hydrogenated polybutadiene skeletons, Mn=1,621, epoxy equivalent (including solvent)=909 g/eq., and solid content=60 wt %)

<Component (c)>

Resin D (having polybutadiene skeletons, Mn=18,125, epoxy equivalent (including solvent)=14, 470 g/eq., and solid content=40 wt %)

Resin E (having hydrogenated polybutadiene skeletons, Mn=17,264, epoxy equivalent (including solvent)=15,187 g/eq., and solid content=40 wt %)

<Component (B)>

"Laicon 131MA17" (a polybutadiene modified with maleic anhydride, Mn=5,100, acid anhydride equivalent= 577 g/eq., and solid content=100 wt %; manufactured by Laicon Resin Co., Ltd.)

Resin F (a polybutadiene having carboxyl groups, Mn=1, 711, acid value (including solvent)=70.1 mgKOH/g, and solid content=60 wt %)

Resin G (a hydrogenated polybutadiene having carboxyl groups, Mn=1,684, acid value (including solvent)=70.7 mgKOH/g, and solid content=60 wt %)

<Component (d)>

Resin H (a polybutadiene having carboxyl groups, Mn=16,244, acid value (including solvent)=3.1 mgKOH/g, and solid content=40 wt %)

Resin I (having hydrogenated polybutadiene skeletons, Mn=17,865, acid value (including solvent) 3.0 mgKOH/g, and solid content=40 wt %)

Resin J (a hydrogenated polybutadiene having an acid anhydride groups, Mn=about 19,962, acid anhydride equivalent (including solvent)=32,059 g/eq., and solid content=40 wt %)<

<Fine Polyamide Particles>

"VENTSINT 2070" (manufactured by Daicel Huls K.K.)<

<Fine rubber particles>

"EXR-91" (manufactured by Japan Synthetic Rubber Co., Ltd.)

Moreover, the components particularly employed as Comparative Examples will be shown below.

"Epikoto 828" (a di-functional epoxy resin having a molecular weight of 800 or less, Mn=about 380, epoxy equivalent=185 g/eq., and solid content=100 wt %; manufactured by Yuka Shell Epoxy Co., Ltd.)

"EPU-11" (a di-functional rubber-modified epoxy resin having a molecular weight of 800 or less, Mn=about 600, epoxy equivalent=300 g/eq., and solid content=100 wt %; manufactured by Asahi Denka Kogyo Co., Ltd.)

"TSR-960" (a di-functional rubber-modified epoxy resin having a molecular weight of 800 or less, Mn=about 480, epoxy equivalent=240 g/eq., and solid content=100 wt %; manufactured by Dainippon Ink & Chemicals, Inc.)

"BN1015" (a maleinated polybutadiene having a functional group number of 1 to 2 per one molecule, Mn=about 1,200, acid anhydride equivalent=774 g/eq., and solid content=100 wt %; manufactured by Nippon Soda Co., Ltd.)

In the following will be illustrated the preparation of curable resin compositions.

EXAMPLES 1–11

The above-mentioned epoxy resin components (A) and (c), resin components (M) and (d) capable of reacting with epoxy groups, and fine rubber particles and fine polyamide particles were appropriately blended. Further, as other components, "PN23" (manufactured by Ajinomoto Co., Inc.) as a curing accelerator, "Aerosil 200" (manufactured by Nihon Aerosil Co., Ltd.) as an anti-sagging agent, and carbitol acetate as a viscosity adjusting solvent were added in appropriate amounts to each blend and mixed, followed by kneading using a three roll mill to prepare Samples A1 to A11. The contents of the composition of each Example, together with the results of measuring the physical properties thereof, will be shown below in Table 1.

The above-mentioned conventional, all-purpose epoxy resins, and epoxy resins generally employed for the purpose of imparting flexibility, and resins capable of reacting with epoxy groups were used in combination with the resins used in Examples, and fine rubber particles and fine polyamide particles were appropriately blended therewith. Then, as other ingredients, "PN23" (manufactured by Ajinomoto Co., Inc.) as a curing accelerator, "Aerosil 200" (manufactured by Nihon Aerosil K.K.) as an anti-sagging agent, and carbitol acetate as a viscosity adjusting solvent were added in appropriate amounts to each blend and mixed, followed by kneading using a three roll mill to prepare Comparative Samples B1 to B5. The contents of the composition of each Comparative Example, together with the results of measuring the physical properties thereof, will be shown below in Table 2.

The preparation of test coated films and the measurement of the properties thereof were carried out as follows.

<Preparation of test coated films>

Samples A1 to A11 prepared according to the compositions shown in Table 1 and Comparative Samples B1 to B5 prepared according to the compositions shown in Table 2 were each coated on appropriate substrates in such amount that the thickness would be about 25 $\mu$m when cured, and subjected to curing treatment under the conditions of 150° C. for 1 hour, whereby test samples were prepared.

<Measurement of the properties of coated films>

With respect to the coated films prepared as mentioned above, the following properties were measured or observed.

(1) Warp caused by cure shrinkage: Sample is coated on a polyimide film of 35 mm×60 mm×75 $\mu$m so as to be 25 mm 35 mm×25 $\mu$m, and after curing at 150° C. for 1 hour, the degree of warp is measured. Further, the degree of warp is again measured after thermal treatment of the test piece at 150° C. for 7 hours.

(2) Bending resistance: A coated film is formed on a polyimide film of 75 $\mu$m thickness according to the method of preparation of test coated films. The film is bent at an angle of 180° and observed with respect to cracks, whitening, or the like, when the bent test piece is drawn through nails.

X: Cracks occur, Δ: whitened, and ○: no abnormality is observed.

(3) Thermal resistance upon soldering: A coated film is formed according to the method of preparation of test coated films and Flux JS-64MS-S is applied onto the film. Then, the applied film is immersed in a soldering bath at 260° C. for 10 seconds.

○: No abnormality is observed, and X: blister is generated.

(4) Electric insulation property: A coated film is formed on a tandem electrode having a conductor width of 0.318 mm, and electric resistance after boiling for 1 hour is measured.

(5) Chemical resistance: A coated film is formed according to the method of preparation of test coated films. Then, the film is rubbed with a waste soaked with i-propanol.

○: No abnormality is observed, and X: coated film deteriorated.

(6) Adhesiveness (copper and polyimide): In accordance with JIS D0202, the test is carried out. A coated film is formed on copper or polyimide according to the method of preparation of test coated films. The coated film is cross-cut at 100×100 and after tape-peeling, the number of remaining blocks is counted.

X: 0/100 to 50/100, Δ: 51/100 to 99/100, and ○: 100/100.

(7) Adhesiveness (IC sealing resins): Onto a TAB tape whose copper has been etched to uncover the adhesive layer, a coated film is formed according to the method of preparation of test coated films. Onto the coated film is applied an IC sealing resin in about 200 μm thickness and cured to obtain a test piece. The test piece is bent with hands, while it is observed how the sealing resin peel off.

IC sealing resin A: "XS8103 (manufactured by Namics Corp.)

IC sealing resin B: "CEL-C-5020" (manufactured by Hitachi Chemical Co., Ltd.)

X: Interfacial failure between the composition-coated film and the IC sealing resin, Δ: Cohesive failure of each of the composition-coated film and the IC sealing resin and interfacial failure are both observed, where the cohesive failure<the interfacial failure, ○: Cohesive failure of each of the composition-coated film and the IC sealing resin are both observed, where the cohesive failure>the interfacial failure, and ⊚: Cohesive failure is observed with respect to both the composition-coated film and the sealing resin.

(8) Pencil hardness: A coated film is formed on a copper according to the method of preparation of test coated films and the hardness was evaluated by a scratching method with pencils. Shown is the symbol of the pencil which is one pencil before the pencil with which the coated film was scratched and the substrate appeared.

(9) Sn-plating resistance: A coated film is formed oni a copper according to the method of preparation of test coated films and the film was immersed in a tin-plating liquid ("TINPOSIT LT34" (SHIPLEY FAR EAST LTD.)) at 70° C. for 5 minutes. After the immersion, the film was sufficiently washed with water and then dried at 80° C. for 30 minutes, and the appearance of the coated film was visually observed.

X): Remarkably deteriorated, Δ: whitened on the surface, and ○: not changed.

TABLE 1

| | | | | (Examples) | | | | | | | | | | |
|---|---|---|---|---|---|---|---|---|---|---|---|---|---|---|
| Components incorporated | | | | A1 | A2 | A3 | A4 | A5 | A6 | A7 | A8 | A9 | A10 | A11 |
| Component (A) | PB epoxy | BF1000 | (a) | 10 | 2 | 1.3 | 10 | 2 | 1.3 | | | | | |
| | hydrogenated PB epoxy | resin C | (b) | | | | | | | 16.7 | 10 | 10.2 | 16.7 | 10 |
| Component (c) | PB epoxy | resin D | (c) | | 20 | | | 20 | | | | | | |
| | hydrogenated PB epoxy | resin E | (d) | | | | | | | | 10 | | | 10 |
| Component (B) | PB acid anhydride | Laicon131MA17 | (e) | 32.4 | 7.3 | 4 | | | | | | | | |
| | PB carboxylic acid | resin F | (f) | | | | 45 | 10 | 5 | | | | | |
| | hydrogenated PB carboxylic acid | resin G | (g) | | | | | | | 14.5 | 9.3 | 8.3 | 14.5 | 9.3 |
| Component (d) | PB carboxylic acid | resin H | (h) | | | | | | 17.5 | | | | | |
| | hydrogenated PB carboxylic acid | resin I | (i) | | | | | | | | | 12.5 | | |
| | PB anhydride | resin J | (j) | | | | 15 | | | | | | | |
| Fine polyamide particles | | VENTSIMT2070 | (k) | | | | | | | | | | 0.5 | 0.5 |
| Fine rubber particles | | XER-91 | (l) | | | | | | | | | | 0.5 | 0.5 |
| Warp (mm) | | after curing (at 150° C. for 1 hour) | (m) | 0.5 | 0.2 | 0.2 | 0.6 | 0.1 | 0.2 | 0.2 | 0.1 | 0.1 | 0.1 | 0.1 |
| | | at 150° C. for 7 hours | (n) | 2.5 | 2.2 | 2.1 | 2.7 | 2.3 | 2.4 | 0.3 | 0.2 | 0.2 | 0.2 | 0.2 |
| Bending resistance | | | (o) | ○ | ○ | ○ | ○ | ○ | ○ | ○ | ○ | ○ | ○ | ○ |
| Thermal resistance upon soldering | | | (p) | ○ | ○ | ○ | ○ | ○ | ○ | ○ | ○ | ○ | ○ | ○ |
| Pencil hardness | | | (q) | 2H | H | H | 2H | H | H | 2H | H | H | H | H |
| Sn-plating resistance | | | (r) | ○ | ○ | ○ | ○ | ○ | ○ | ○ | ○ | ○ | ○ | ○ |
| Adhesiveness (1) | | onto copper | (s) | ○ | ○ | ○ | ○ | ○ | ○ | ○ | Δ | Δ | ○ | ○ |
| | | onto polyimide | (t) | ○ | ○ | ○ | ○ | ○ | ○ | ○ | ○ | ○ | ○ | ○ |
| Adhesiveness (2) | | Confining resin A | (u) | ○ | ○ | ○ | ○ | ○ | ○ | ○ | Δ | Δ | ⊚ | ○ |
| | | Confining resin B | (v) | ○ | Δ | Δ | ○ | Δ | Δ | Δ | Δ | Δ | ○ | ○ |
| Chemical resistance | | isopropanol-rubbing | (w) | ○ | ○ | ○ | ○ | ○ | ○ | ○ | ○ | ○ | ○ | ○ |
| Electric insulation property (Ω) | | | (x) | 10th power | 10th power | 10th power | 10th power | 10th power | 10th power | 10th power | 10th power | 10th power | 10th power | 10th power |

TABLE 2

(Comparative Examples)

| | Components incorporated | | B1 | B2 | B3 | B4 | B5 |
|---|---|---|---|---|---|---|---|
| Epoxy resin | Molecular weight 800 or less | Epikoto | 10 | | | | |
| | | EPU-11 | | 10 | | | |
| | | TSR-760 | | | 10 | | |
| | Resin used in Example | resin C | | | | 51 | |
| | Resin used in Example | resin D | | | | | 25 |
| Curing agent | Functional group number: 1–2 | BN1015 | | | | 43.5 | |
| | Resin used in Example | Laicon131MA17 | 31.2 | 19.2 | 12 | | |
| | Resin used in Example | resin H | | | | | 31.1 |
| Warp (mm) | | after curing (at 150° C. for 1 hour) | 3.1 | 1.7 | 1.8 | 0.2 | 0 |
| | | at 150° C. for 7 hours | 4.5 | 3.1 | 3.2 | 0.7 | 0.1 |
| Bending resistance | | | Δ | ○ | ○ | ○ | ○ |
| Thermal resistance upon soldering | | | ○ | ○ | ○ | X | X |
| Pencil hardness | | | 2H | 2H | 2H | B | 2B |
| Sn-plating resistance | | | ○ | ○ | ○ | ○ | ○ |
| Adhesiveness (1) | | onto copper | ○ | ○ | ○ | ○ | ○ |
| | | onto polyimide | ○ | ○ | ○ | ○ | ○ |
| Adhesiveness (2) | | Confining resin A | ○ | ○ | ○ | ○ | ○ |
| | | Confining resin B | ○ | ○ | ○ | Δ | Δ |
| Chemical resistance | | isopropanol-rubbing | ○ | ○ | ○ | X | X |
| Electric insulation property (Ω) | | | 10th power | 10th power | 10th power | 8th power | 9th power |

It can be understood from the measuring results shown in the above Tables 1 and 2 that cured coated films resulting from curing the thermosetting resin compositions of the present invention are small in warp, compared with those films resulting from curing conventional compositions, and particularly in the case of those using the resins wherein the double bonds in the molecule have been hydrogenated, increase of warp is hardly observed even after being allowed to stand for a long time at an elevated temperature. In addition, since the cured coated films are excellent in adhesiveness, chemical resistance, thermal resistance, and bending resistance, it is understood that the thermosetting resin compositions of the present invention are suitable for the applications including the adhesion between flexible substrates such as packaging materials and films, and the coating of the surface thereof. Moreover, since the cured coated films are also excellent in electric insulation property and adhesiveness onto copper and polyimide films, the thermosetting resin compositions of the present invention are useful as overcoating agents for flexible circuit boards. Furthermore, since the cured coated films are also excellent in Sn-plating resistance and adhesiveness onto IC sealing resins, the compositions are also suitable for utilizing as overcoating agents of film carriers for the TAB method.

INDUSTRIAL APPLICABILITY

Cured coated films resulting from curing the thermosetting resin compositions of the present invention are, compared with those films resulting from curing conventional compositions, particularly small in increase of warp even after being allowed to stand for a long time at an elevated temperature, and also the films are excellent in flexibility, chemical resistance, thermal resistance, electric insulation property, Sn-plating resistance, and adhesiveness to copper and polyimides films, so that the compositions of the present invention are useful for the applications including the adhesion between flexible substrates such as packaging materials and films, and the coating of the surface thereof, and further useful as overcoating agents for flexible circuit boards and overcoating agents of film carriers.

What is claimed is:

1. A thermosetting resin composition wherein an epoxy resin (Component (c)) which has a number average molecular weight of 7,000 to 35,000, an average functional group number of 2 or more per one molecule, and a functional group equivalent of 2,000 to 18,000 g/mol, and which may have a polybutadiene or hydrogenated polybutadiene skeleton, is incorporated in combination with the Component (A) which has a number average molecular weight of 800 to 35,000, an average functional group number of more than 2 per one molecule, and a functional group equivalent of 150 to 2,000 g/mol, and which may have a polybutadiene or hydrogenated polybutadiene skeleton, both resins being incorporated in such ratio that the total average equivalent becomes 300 to 2,000 g/mol (both resins being collectively referred to herein as Component (C)), and a resin (Component (d)) which has a number average molecular weight of 7,000 to 35,000, an average functional group number of 2 or more per one molecule, and a functional group equivalent of 2,000 to 18,000 g/mol, which has one or more functional groups selected from carboxyl group, amino group, acid anhydride group, hydrazide group, mercapto group, hydroxyl group and isocyanate group, and no blocked carboxyl group, and which may have a polybutadiene or hydrogenated polybutadiene skeleton, is incorporated in combination with the Component (B) which has a number average molecular weight of 800 to 35,000, an average functional group number of more than 2 per one molecule, and a functional group equivalent of 150 to 2,000 g/mol, which has one or more functional groups selected from amino group, carboxyl group, acid anhydride group, mercapto group, hydroxyl group, isocyanate group and hydrazide group, and no blocked carboxyl group, and which may have a polybutadiene or hydrogenated polybutadiene skeleton, both resins being incorporated in such ratio that the total average equivalent becomes 300 to 2,000 g/mol (both resins being collectively referred to herein as Component (D)), and wherein the ratio of the Component (D) to the Component (C) is from 0.5 to 2.0 in terms of the overall equivalent number of the functional group (s) of Component (D) capable of reacting with the epoxy group of the Component (C) to the overall equivalent number of the epoxy group of the Component (C).

2. A thermosetting resin composition wherein the Component (A) which has a number average molecular weight of 800 to 35,000, an average functional group number of more than 2 per one molecule, and a functional group equivalent of 150 to 2.000 g/mol, and which may have a polybutadiene or hydrogenated polybutadiene skeleton, and a resin (Component (d)) which has a number average molecular weight of 7,000 to 35,000, an average functional group number of 2 or more per one molecule, and a functional group equivalent of 2,000 to 18,000 g/mol, which has one or more functional groups selected from carboxyl group, amino group, acid anhydride group, hydrazide group, mercapto group, hydroxyl group and isocyanate group, and no blocked carboxyl group, and which may have a polybutadiene or hydrogenated polybutadiene skeleton, is incorporated in combination with the Component (B) which has a number average molecular weight of 800 to 35.000, an average functional group number of more than 2 per one molecule, and a functional group equivalent of 150 to 2,000 g/mol, which has one or more functional groups selected from amino group, carboxyl group, acid anhydride group, mercapto group, hydroxyl group, isocyanate group and hydrazide group, and no blocked carboxyl group, and which may have a polybutadiene or hydrogenated polybutadiene skeleton, both resins being incorporated in such ratio that the total average equivalent becomes 300 to 2,000 g/mol (both resins being collectively referred to herein as Component (D)), and wherein the ratio of the Component (D) to the Component (A) is from 0.5 to 2.0 in terms of the overall equivalent number of the functional group(s) of Component (D) capable of reacting with the epoxy group of the Component (A) to the equivalent number of the epoxy group of the Component (A).

3. A thermosetting resin composition wherein an epoxy resin (Component (c)) which has a number average molecular weight of 7,000 to 35,000, an average functional group number of 2 or more per one molecule, and a functional group equivalent of 2,000 to 18,000 g/mol, and which may have a polybutadiene or hydrogenated polybutadiene skeleton; is incorporated in combination with the Component (A) which has a number average molecular weight of 800 to 35,000, an average functional group number of more than 2 per one molecule, and a functional group equivalent of 150 to 2,000 g/mol, and which may have a polybutadiene or hydrogenated polybutadiene skeleton, both resins being incorporated in such ratio that the total average equivalent becomes 300 to 2,000 g/mol (both resins being collectively referred to herein as Component (C)) and the Component (B) which has a number average molecular weight of 800 to 35,000, an average functional group number of more than 2 per one molecule, and a functional grout) equivalent of 150 to 2,000 g/mol, which has one or more functional groups selected from amino group, carboxyl group, acid anhydride group, mercapto group, hydroxyl group isocyanate group and hydrazide group, and no blocked carboxyl group, and which may have a polybutadiene or hydrogenated polybutadiene skeleton, and wherein the ratio of the Component (B) to the Component (C) is from 0.5 to 2.0 in terms of the equivalent number of the functional group(s) of Component (B) capable of reacting with the epoxy group of the Component (C) to the overall equivalent number of the epoxy group of the Component (C).

4. An overcoating agent for flexible circuit boards, wherein said thermosetting resin composition as in claim 1 is employed.

5. A film carrier comprising an insulating film and a pattern formed thereon of metal thin film, with a part or all of the insulating film in the folded region having been removed, wherein the circuit pattern side except the joint region including the folded region, is coated with said overcoating agent of claim 4 and cured.

6. A film carrier device employing said film carrier of claim 5.

7. An overcoating agent for flexible circuit boards, wherein said thermosetting resin composition as in claim 2 is employed.

8. A film carrier comprising an insulating film and a pattern formed thereon of metal thin film, with a part or all of the insulating film in the folded region having been removed, wherein the circuit pattern side except the joint region including the folded region, is coated with said overcoating agent of claim 7 and cured.

9. A film carrier device employing said film carrier of claim 8.

10. An overcoating agent for flexible circuit boards, wherein said thermosetting resin composition as in claim 3 is employed.

11. A film carrier comprising an insulating film and a pattern formed thereon of metal thin film, with a part or all of the insulating film in the folded region having been removed, wherein the circuit pattern side except the joint region including the folded region, is coating with said overcoating agent of claim 10 and cured.

12. A film carrier device employing said film carrier of claim 11.

* * * * *